United States Patent [19]

Zauhar et al.

[11] 4,175,610

[45] Nov. 27, 1979

[54] PROCESS AND APPARATUS FOR THE SEMICONTINUOUS PRODUCTION OF SILICON MOLDINGS

[75] Inventors: Helmut Zauhar; Bernhard Authier, both of Burghausen; Roland Luptovits, Emmerting; Leonhard Schmidhammer, Kirchheim, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 925,506

[22] Filed: Jul. 17, 1978

[30] Foreign Application Priority Data

Oct. 7, 1977 [DE] Fed. Rep. of Germany ....... 2745247

[51] Int. Cl.$^2$ ...................... B22D 15/00; B22D 25/06; B22C 9/20

[52] U.S. Cl. ...................................... 164/60; 164/322; 164/127; 164/61; 164/66; 164/130; 164/253; 164/335

[58] Field of Search ...................... 164/60, 65, 76, 125, 164/126, 127, 128, 129, 130, 133, 270, 322, 323

[56] References Cited

U.S. PATENT DOCUMENTS

| | | | |
|---|---|---|---|
| 3,601,179 | 8/1971 | Taylor | 164/60 X |
| 3,677,324 | 7/1972 | Higginbotham et al. | 164/60 |
| 3,895,672 | 7/1975 | King, Jr. et al. | 164/60 |

FOREIGN PATENT DOCUMENTS 2508803 9/1976 Fed. Rep. of Germany ............ 164/60

*Primary Examiner*—Robert D. Baldwin
*Assistant Examiner*—K. Y. Lin
*Attorney, Agent, or Firm*—Allison C. Collard; Thomas M. Galgano

[57] ABSTRACT

The invention relates to a process and apparatus for manufacturing silicon castings or moldings, having a columnar structure of single-crystal regions of crystal with a preferential crystallographic orientation, and which can be manufactured cheaply and in large numbers in a semi-continuous mode of production. Liquid silicon is cast in a casting station, under an inert gas and preferably under reduced pressure, preferably in graphite molds which are exposed to a temperature gradient of 200° to 1,000° C. After cooling, the silicon is withdrawn automatically via a transport chamber connected to the casting station into special cooling stations, while the casting station is reloaded with an empty mold for repeating the process. The silicon blocks which have preferably been produced by this procedure are use as basic material for inexpensive solar cells having efficiencies of more than 10%, after they have been sawn into individual small wafers and have been doped and lead-bonded.

18 Claims, 1 Drawing Figure

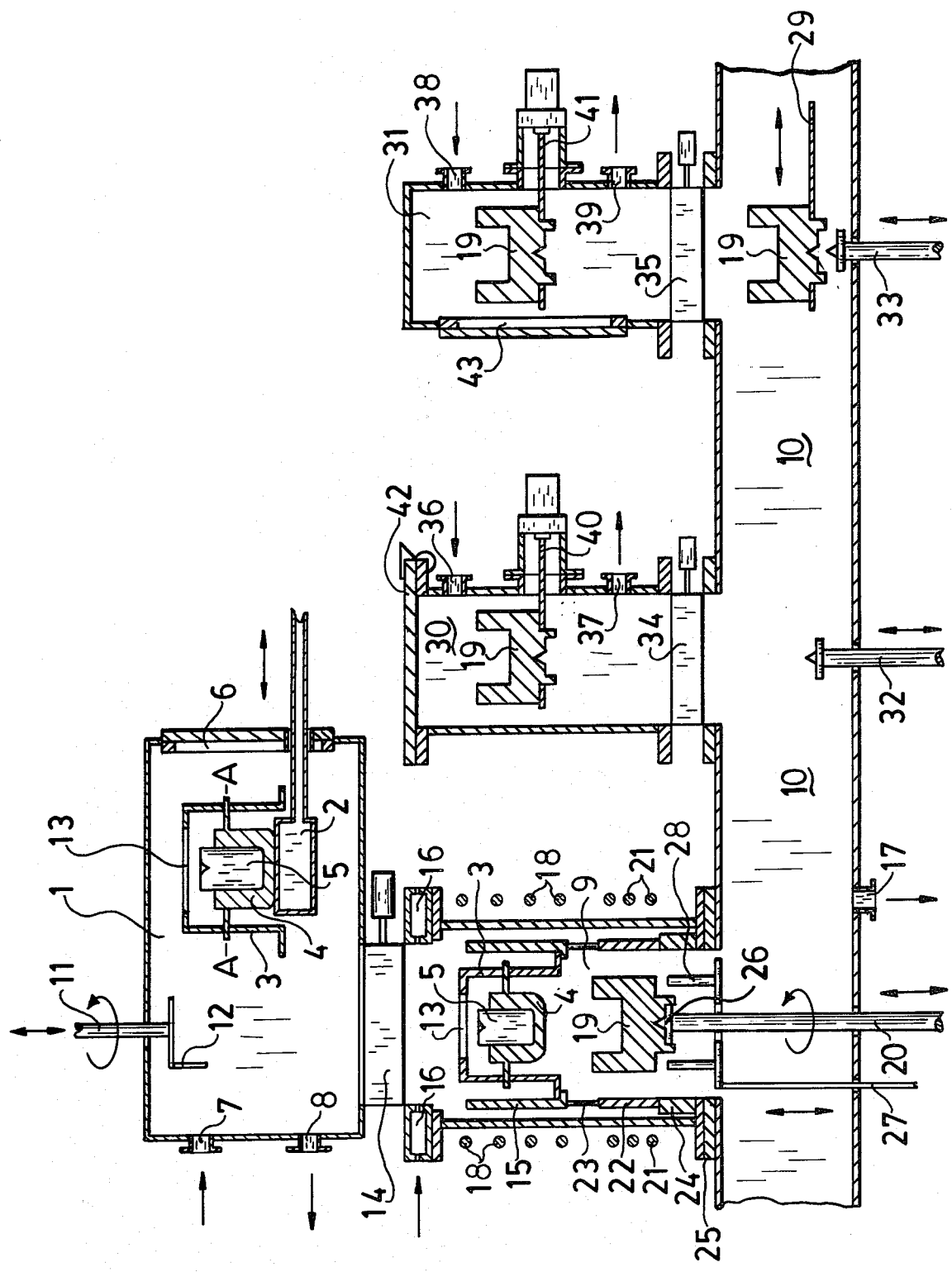

PROCESS AND APPARATUS FOR THE SEMICONTINUOUS PRODUCTION OF SILICON MOLDINGS

The invention relates to a process and apparatus for the semi-continuous production of silicon castings having a columnar structure consisting of single-crystal regions of crystal with a preferential crystalographic orientation, by casting a silicon melt in a suitable mold and subsequently allowing it to solidify in a temperature gradient of 200° to 1,000° C., which is applied vertically to the mold.

Due to the increasing shortage and higher price of fossil fuels, solar cells made of silicon, which permit the direct conversion of solar energy into electrical energy, are gaining increasing importance. While this type of energy generation, using solar cells of a single-crystal silicon, is presently the dominant form in the field of satellite technology, silicon solar cells of this type are much too expensive for a terrestrial application. German patent DT-AS No. 2,508,803 has disclosed novel polycrystalline silicon moldings and a process for the manufacture thereof, wherein the castings can be employed, with appropriate doping, as the base material for solar cells, having an efficiency of about 10%. Admittedly, these solar cells do not quite reach the efficiency of solar cells made from single-crystal silicon of best quality, but are incomparably cheaper to manufacture and thus represent the starting point for an economic exploitation of solar energy. To reach a really competitive energy price, it is, however, absolutely necessary to manufacture polycrystalline silicon of this type cheaply by an optimized process in a plant which is suitable for mass production.

It is, therefore, an object of the invention to provide a manufacturing process, which is optimized in this way, and apparatus for carrying it out.

In the process of the invention, silicon, placed in readiness, is introduced cyclically into a vacuum-tight casting station. The station can be evacuated under an atmosphere which is inert to silicon. The silicon is cast in a mold which is exposed to a vertical temperature gradient of 200° to 1000° C. by means of a suitable heater device. After the silicon has solidified, the mold is transferred into a vacuum-tight tranport chamber which is connected to the casting station. The mold is introduced via the transport chamber into a cooling station which is separated off by a vacuum-tight valve means, so that the mold can be withdrawn after it has cooled down. At the same time, a further mold is conveyed from a loading station via the transport chamber into the casting station and is filled, by casting, with a new charge of silicon.

The apparatus for carrying out this process includes: a vacuum-tight casting station which can be evacuated and has a vacuum-tight valve means. There is a heater device which determines the temperatures in the casting chamber. A mold is provided for receiving silicon and can be moved in at least one spatial direction by means of a suitable holder. A vessel which is located above the mold, is appropriately shaped and supported for releasing molten silicon and is essentially resistant to silicon. There is a transport chamber connected to the casting station and has devices for moving the mold in at least two spatial directions. There also are inlet and outlet gas lines leading into the casting station and transport chamber. There are cooling stations separated from the transport chamber by vacuum-tight valve means, and have inlet and outlet gas lines as well as holders for the mold and vacuum-tight devices for isolation from the exterior.

According to a preferred embodiment of the apparatus, a recharging chamber is also provided upstream of the vacuum-tight casting station. The recharging station has a vacuum-tight device for isolation from the casting station, and a vacuum-tight device for isolation from the exterior, as well as inlet and outlet gas lines, and one or more receiver devices for melting vessels.

The process and apparatus are described in detail in the following text by reference to the FIGURE.

The FIGURE diagrammatically shows a possible embodiment of the apparatus according to the invention.

Referring to the FIGURE, there is shown a crucible 4 which is held so that it can pivot about a horizontal axis A-A in a holding bracket 3. A melting vessel 5, preferably of quartz or silicon nitride, is designed to fit inside crucible 4 within the frame structure of bracket 3. Bracket 3 is preferably constructed or graphite. Solid silicon in compact lumps are inserted in vessel 5. Crucible 4 sits on a water-cooled plate 2 which can be shifted horizontally, into recharging chamber 1 through a vacuum-tight valve means 6 in the form of a door or flap. After the vacuum-tight valve means 6 has been closed, the air is evacuated from recharging chamber 1 and the latter is filled with inert gas, by means of the gas inlet and outlet lines 7 and 8. The pressure in recharging chamber 1 is set to the working pressure in a casting station 9. The working pressure is equal to the pressure in a further working chamber 10, which is openly connected to the casting station, and is usually about 0.1 to 150 millibars, preferably about 1 to 15 millibars. A shaft 11 is provided which can rotate about the longitudinal axis, and can move in the vertical direction. Shaft 11 has on its underside a hook 12 which can engage with a slot 13 on the top of holding bracket 3. Crucible 4 with melting vessel 5 is lowered into the casting station 9 through a vacuum-tight valve means 14, which is in the form, for example, of a water cooled vacuum valve, and is deposited on appropriate holders, for example in the form of a graphite tube 15 which is shaped correspondingly and fits into the casting station. The casting station is blanketed continuously with an inert gas, for example argon, through a gas feed 16 which, for example, extends like an annulus alongs its upper rim. The inert gas together with the waste gases formed are pumped out through an outline line 17, for example in the bottom of the transport chamber. The throughput of argon or the intensity of extraction are set in order to establish a desired working pressure desired in the transport chamber 10 and casting chamber 9. The preferential feeding of inert gas at the upper rim of casting station 9 prevents, in particular, the deposition of silicon monoxide formed. The continuous extraction which is preferably carried out in the transport chamber 10, and in the vicinity of the casting station 9, prevents the mechanism for transporting the molds from being adversely affected by dust particles.

The heat which is necessary to melt the solid silicon present in melting crucible 5, is generated by a suitable heater device, such as an induction heating coil 18. Coil 18 surrounds the outside of the upper part of casting station 9 with several windings. Thus it is possible to inductively heat graphite heater tube 15 which extends around the inside of casting station 9. It is also possible to employ a different heating system, for example a resistance heater, in place of the inductive heater. The heating power of the particular heater used is preferably adjusted so that the silicon has a temperature of about 1,450° to 1,600° C. after melting. Moreover, it is advantageous to let the heater run continuously in order to maintain the temperature of casting station 9, as a result of which valuable time can be saved when the next charge of silicon is melted.

Underneath melting vessel 5 which contains the molten silicon, there is a mold 19, preferably made of graphite, which is disposed on a rotatable shaft 20. Shaft 20 is movable in the vertical direction and is water-cooled. Mold 19 can also be heated by a suitable heater device. This is preferably accomplished by a second induction heating coil 21 which has several windings and surrounds the outside of the lower part of casting station 9 at the level of mold 19. There is a second graphite heater tube 22 located at the same level as mold 19. Heater tube 22 is connected to upper graphite heater tube 15, for example, by carbon rods 23, and is heated up by induction heating coil 21. Graphite heater tube 22 is insulated at its bottom by a quartz ring 24. Ring 24 is supported on a metal flange 25 so as to join the casting station to working chamber 10.

After all of the solid silicon in melting crucible 5 has been melted by the radiant heat of graphite tube 15 which is inductively heated up by means of induction heating coil 18, melting crucible 5 is tilted about a horizontal axis, for example, by means of hook 12 on the end of shaft 11, so that the molten silicon flows out into mold 19. Mold 19 is disposed below crucible 5, and is rotated about its central longitudinal axis by means of shaft 20. Before the silicon melt is cast, mold 19 is heated up to a minimum temperature of between 500° to 1,200° C. by the radiant heat from graphite tube 22 which is inductively heated by induction heating coil 21. When the melt is first cast, this heater can then be switched off. A temperature gradient of 200° to 1,000° C. can be established by intense cooling of the bottom of the mold. This intense cooling is preferably accomplished by means of heat exchange surface 26, for example made of copper, which is fitted on the upper end of shaft 20 and through which cooling water flows. The upper part of the mold and the surface of the cast silicon are prevented from solidifying too rapidly by the heat radiation from hot carbon crucible 4 located above and by the heat radiation from upper graphite tube 15. For additional control of the cooling process, mold 19 can also be separated from shaft 20. This is accomplished by a second shaft 27 which preferably can engage mold 19, can be moved in the vertical direction, and can be cooled. Shaft 27 supports the outside of the mold 19, for example by means of an upper annular support frame 28, so that shaft 20 can be retracted downwards until cooling surface 26 is no longer in contact with the bottom of mold 19.

When all the silicon has been cast from melting vessel 5, there is a sufficient amount of melt, because of the dimensions of this crucible or the dimensions of mold 19 standing underneath, to fill one or more of these molds. Vacuum-tight valve 14, which has been closed after melting vessel 5 was lowered from recharging receiver 1, is now opened after a gas pressure corresponding to the gas pressure in the casting station has been established in the recharging chamber 1. The crucible 4 is then pulled up into the latter by means of vertically movable shaft 11 with the aid of hook 12 engaging in slot 13 and is deposited on water-cooled plate 2 which can be shifted horizontally. According to a preferred embodiment, there is in recharging receiver 1, opposite plate 2 which can be shifted, a further water-cooled plate of this type, which can be horizontally shifted and which is arranged at an angle of 90° to the first plate. The further plate can be moved out of recharging receiver 1 through a further vacuum-tight door or flap. Advantageously, a further melting vessel, filled with silicon, is already placed in readiness on this second feed-through slide. When the empty melting vessel has been drawn up from the casting station, deposited on the first feed-through slide and pulled to the side, the further melting vessel is moved on into the center of recharging receiver 1, taken up by hook 12 of vertically movable shaft 11, and lowered into casting station 9. After shaft 11 has been retracted, vacuum-tight valve 14 is closed, the pressure of inert gas in the recharging receiver is raised and a cooling gas circulation is set in motion so that the empty crucible which is still in the recharging receiver, on former plate 2 which can be shifted, can rapidly be cooled down to a lower temperature. After the empty crucible has approximately reached room temperature, vacuum-tight door or flap 6 is opened, plate 2 which can be shifted is moved out completely and the empty crucible is replaced by a new crucible filled with silicon. Subsequently, this filled crucible is again moved into recharging receiver 1 and vacuum-tight door 6 is closed.

After the silicon has solidified in mold 19 in the casting station, the mold is lowered by means of vertically movable shaft 20 into transport chamber 10. The mold is then taken from this shaft by means of a holding fork formed on the front end of a transport carriage 29 which is horizontally movable in transport chamber 10. The mold is then conveyed to a position underneath one of the cooling stations 30 or 31. Before mold 19 is taken from carriage 29 by water-cooled, vertically movable shafts 32 or 33 and moved into cooling stations 30 or 31, after the corresponding vacuum-tight valve means 34 or 35 respectively have been opened, these cooling stations are charged with inert gas, such as argon, via the gas inlet or outlet branches 36 and 37, or 38 and 39 respectively. A working pressure corresponding to the working pressure in the transport chamber 10 is thus established in these cooling stations. In the cooling stations, hold mold 19, filled with solidifed silicon, is taken from shafts 32 or 33 by horizontally movable sliding forks 40 or 41 respectively. After the vertically movable shafts 32 or 33 have been retracted, vacuum valves 34 or 35 respectively are closed and a cooling gas, for example argon, flows through the cooling station in which hot mold 19 is located. In order to accelerate the cooling process, the cooling gas is advantageously pumped through the cooling station under elevated pressue, such as up to 2 bars. After the molds filled with silicon have fully cooled down, they are taken out of the cooling station manually by opening the vacuum-tight valve means. Thus a flap 42 located at the top, or a door 43, is opened sideways. These cooling stations are also employed at the same time as charging stations for empty molds. In this case, an empty mold is deposited on the slider 40 or 41 after the filled cooled mold has been taken out. Valve means 42 or 43 respectively are again closed so that they are vacuum-tight. An inert gas pressure corresponding to the working pressure in transport chamber 10 is then established. Vacuum valve 34 or 35 is opened and the empty mold is taken from slider 40 or 41 by an upward motion of the vertically movable shafts 32 or 33 respectively. The mold is moved into transport chamber 10 by lowering shafts 32 or 33. Vacuum valves 34 or 35 are then reclosed. Empty mold 19 is taken from shaft 32 or 33 by horizontally movable carriage 29, and conveyed to a position above the water cooled rotatable shaft 20 underneath the casting station. The empty mold is then moved into casting station 9 by an upward motion of shaft 20.

This procedure is advantageously controlled in such a way that, after a filled mold has been taken by carriage 29 from shaft 20 and has been placed onto shaft 32 which conveys the filled mold into cooling station 30, horizontally movable carriage 29 moves on immediately and takes up an empty mold which has already been moved from cooling station 31 into the transport chamber 10 by means of vertically movable shaft 33, conveys it to a position underneath casting station 9 and moves it into the casting station by means of the vertically movable shaft 20 in order to receive a new charge of silicon.

In the case of relatively large installations, such as, for example, an annular closed transport chamber or an elongated transport chamber having several casting stations, a plurality of cooling stations and, separate, charging stations are possible. It is advantageous to work, in the transport chamber, with several carriages which can be shifted horizontally so that it is possible, after a filled mold has been moved out of the particular casting station, to immediately place an empty mold onto the shafts to transport the molds into the casting stations.

The horizontal transport of the molds or cooling in the transport chamber is advantageously effected with carriages having rotatable forks which can be loaded on one or both sides, and which are moved into the appropriate positions underneath the cooling stations, charging stations or casting stations. These are moved by an electronically controlled stepping motor drive. In place of a stepping motor drive, drives for the carriage with conventional motors are also possible, the positions being tapped by electric contacts. Advantageously, all the transport motions are generally secured against collisions by means of inductive heads. The information as to whether selected positions are already occupied by molds can, for example, be obtained via photoelectric cells. Accurate centering of the molds above the individual shafts is advantageously effected by means of index pins, that is to say pins with conically shaped tips, on the top of the shafts. The pins are conically shaped and engage in recesses in the molds.

In place of the embodiment which has been described and which has a recharging chamber and a device for melting solid silicon in the casting station, the process and the equipment can also be varied in such a way that the silicon is tapped batchwise in the melt from purification devices, such as are described, for example, in German Offenlegungsschriften Nos. 2,722,783, 2,722,784 or 2,729,464, and is cast in the casting station into the mold which is exposed to a temperature gradient.

Furthermore, it is possible to vary the process in such a way that the molds, in particular in the case of large molds, are not filled by one casting, but that several charges are cast successively. In this case, it is appropriate to always carry out the next casting when the amount of melt which has been cast beforehand has solidified.

The process described and the apparatus according to the invention for carrying out the process make possible the mass production, by a largely continuous procedure, of silicon moldings and cast blocks with almost any desired cross-section and in a size which in principle is not restricted. Cast blocks having a square cross-sectional are of 100 to 1,000 $cm^2$ and rounded corners, and a length of 25 to 100 cm are the most advantageous for further processing to provide solar cells. After individual small plates have been obtained by sawing, for example in accordance with the multiple-lapping separation process, as described in DT-OS 2,722,782, and after appropriate doping and lead-bonding, cheap solar cells are obtained which have an efficiency of more than 10% and which can be employed economically in many fields.

While several embodiments of the present invention have been shown and described, it will be obvious to those persons of ordinary skill in the art, that many changes and modifications may be made thereunto, without departing from the spirit and scope of the invention.

What is claimed is:

1. A process for the semi-continuous production of silicon castings having a columnar structure composed of monocrystalline zones having a preferential crystallographic orientation, comprising the steps of:
   (a) introducing a charge of silicon into an evacuable, vacuum-tight casting station, under an atmosphere which is inert with respect to silicon;
   (b) introducing said silicon charge into an empty mold disposed in said casting station which is exposed to a vertically-oriented temperature gradient of 200° C. to 1,000° C. by means of a heating device and effecting the solidification of said silicon in said temperature gradient to produce a casting;
   (c) transferring the mold and casting into a vacuum-tight transport chamber which communicates with said casting station;
   (d) transferring the mold and casting from said transport chamber into a cooling station which is connected to said transport chamber via a vacuum-tight valve means and cooling said casting and mold in said cooling station;
   (e) withdrawing said casting and mold from said cooling station following cooling thereof while conveying an empty mold from a loading station via said transport chamber into said casting station; and
   (f) repeating steps (a)–(e) in a cyclical manner so as to produce silicon castings in a semi-continuous manner.

2. The process according to claim 1, wherein said silicon is introduced into said casting station in solid form from a recharging station which is connected to said casting station via a vacuum-tight valve means, and following said step (a), heating said charge of silicon to produce a melt.

3. The process according to claim 2, wherein said heating step includes melting said solid silicon in a crucible heated by a heating device, which crucible is tiltable about a horizontal axis and is disposed above said mold.

4. The process according to claim 1, additionally including the step of rotating said mold about its longitudinal axis during said step (b).

5. The process according to claim 1, additionally including the step of establishing a working pressure of $10^{-1}$ to 150 millibars in said casting station and said transport chamber.

6. The process according to claim 1, additionally including the steps of continuously feeding an inert gas to said casting station and said transport chamber and continuously extracting said gas, together with the waste gas formed therefrom.

7. The process according to claim 1, additionally including the step of establishing a flow of cooling gas through said cooling station.

8. Apparatus for the semi-continuous production of silicon castings having a columnar structure composed of monocrystalline zones having a preferential crystallographic orientation, comprising:
   a vacuum-tight casting station which can be evacuated and which includes a vacuum-tight valve means;
   a mold for receiving a molten charge of silicon which is movable in at least one spatial direction;
   a holder for moving said mold in said at least one spatial direction;
   a melting vessel disposed above said mold which is essentially resistant to silicon and which is configured and supported to permit release of a molten charge of silicon contained therein into said mold;
   a transport chamber which communicates with said casting station and which includes means for moving said mold in at least two spatial directions;
   inlet and outlet gas lines leading respectively, into and out from, said casting station and said transport chamber;
   at least one cooling station which is connected to said transport chamber via a vacuum-tight isolation device and which includes an inlet and an outlet gas line for feeding a cooling gas therethrough and a holder for supporting a mold, said cooling station being isolated from the outside atmosphere via a further vacuum-tight isolation device.

9. The apparatus according to claim 8, additionally including a re-charging chamber, disposed upstream of said vacuum-tight casting station, which has a vacuum-tight device for isolation from said casting station and a vacuum-tight device for isolation from the outside atmosphere, as well as inlet and outlet gas lines and at least one receiver device for supporting a melting vessel.

10. The apparatus according to claim 9, wherein said receiver device comprises a water-cooled plate which can be moved in a horizontal direction.

11. The apparatus according to claim 9, wherein said recharging chamber is located above said casting station.

12. The apparatus according to claim 11, wherein said re-charging chamber includes means for raising and lowering said melting vessel.

13. The apparatus according to claim 9, wherein said casting station is equipped with a first heater device for establishing a vertically-directed temperature gradient and a second heater device, independent of said first heater device, for melting said charge of silicon introduced from the re-charging chamber into said melting vessel disposed in said casting station.

14. The apparatus according to claim 8, wherein said casting station and said cooling station are supported on a transport chamber of annular configuration.

15. The apparatus according to claim 14, wherein in said casting station, said mold is supported on the upper end of a shaft which is cooled and which can rotate about its longitudinal axis.

16. The apparatus according to claim 15, wherein said shaft is movable in a vertically reciprocable fashion for movement between an upper position, in which the upper end thereof is disposed in said casting station for supporting said mold, and a lower position, in which said upper end thereof is disposed in said transfer chamber, and wherein said apparatus additionally includes further vertically-reciprocable shafts movable between an upper position, in which the upper end thereof is disposed in said cooling station, and a lower position, in which said upper end thereof is disposed in said transport chamber, and a horizontally-reciprocable carriage disposed in said transport chamber for movement between the lower positions of said shafts for transferring a mold from one shaft to the other.

17. The apparatus according to claim 15, wherein the first-mentioned shaft is cooled by liquid and is provided with a heat exchange surface at the upper end thereof.

18. The apparatus according to claim 16, additionally including at least one sliding fork disposed in said cooling station, for receiving the mold from said second shaft when in said upper position thereof.

* * * * *